United States Patent [19]

Markunas et al.

[11] Patent Number: 4,870,030
[45] Date of Patent: Sep. 26, 1989

[54] REMOTE PLASMA ENHANCED CVD METHOD FOR GROWING AN EPITAXIAL SEMICONDUCTOR LAYER

[75] Inventors: Robert J. Markunas, Chapel Hill; Robert Hendry, Hillsborough; Ronald A. Rudder, Cary, all of N.C.

[73] Assignee: Research Triangle Institute, Inc., Research Triangle Park, N.C.

[21] Appl. No.: 100,477

[22] Filed: Sep. 24, 1987

[51] Int. Cl.$^4$ .................. H01L 21/20; H01L 21/306
[52] U.S. Cl. ................ 437/81; 148/DIG. 6; 148/DIG. 25; 148/DIG. 45; 427/39; 156/610; 156/612; 437/18; 437/85; 437/87; 437/100; 437/171; 437/173
[58] Field of Search ............... 148/DIG. 1, DIG. 6, 148/22, 25, 45, 79; 118/723, 50.1; 427/38, 39; 156/610–614; 437/18, 85, 87, 100, 81, 106, 171, 937, 939, 946, 949, 170, 173

[56] References Cited

U.S. PATENT DOCUMENTS

| | | | |
|---|---|---|---|
| 3,617,371 | 11/1971 | Burmeister | 156/611 |
| 3,630,678 | 12/1971 | Gardner | 156/574 |
| 3,630,679 | 12/1971 | Angus | 423/446 |
| 3,661,526 | 5/1972 | Angus et al. | 423/446 |
| 3,961,103 | 6/1976 | Aisenberg | 427/39 |
| 4,123,316 | 10/1978 | Tsuchimoto | 156/643 |
| 4,220,488 | 9/1980 | Duchemin et al. | 437/87 |
| 4,262,631 | 4/1981 | Kubacki | 118/723 |
| 4,365,587 | 12/1982 | Hirose et al. | 118/723 |
| 4,421,592 | 12/1983 | Shuskus et al. | 156/613 |
| 4,434,742 | 3/1984 | Henaff et al. | 118/723 |
| 4,439,463 | 3/1984 | Miller | 427/39 |
| 4,450,185 | 5/1984 | Shimizu et al. | 427/39 |
| 4,461,783 | 7/1984 | Yamazaki | 427/39 |
| 4,483,883 | 11/1984 | Nath et al. | 427/39 |
| 4,485,121 | 11/1984 | Matsumura | 427/39 |
| 4,500,565 | 2/1985 | Hiramoto | 427/39 |
| 4,507,169 | 3/1985 | Nogami | 156/606 |
| 4,509,451 | 4/1985 | Collins et al. | 118/50.1 |
| 4,513,684 | 4/1985 | Nath et al. | 118/718 |
| 4,522,674 | 6/1985 | Ninomiya et al. | 118/50.1 |
| 4,526,805 | 7/1985 | Yoshizawa | 427/38 |
| 4,532,199 | 7/1985 | Ueno et al. | 427/39 |

(List continued on next page.)

FOREIGN PATENT DOCUMENTS

| | | | |
|---|---|---|---|
| 0074212 | 3/1983 | European Pat. Off. | |
| 0064124 | 4/1986 | Japan | 118/723 |
| 1194824 | 8/1986 | Japan | 118/723 |
| 8100862 | 5/1981 | PCT Int'l Appl. | |

OTHER PUBLICATIONS

Richard et al., Remote Plasma Enhanced CVD Deposition of Silicon Nitride and Oxide for Gate Insulators in (In,Ga)As FET Devices, J. Vac. Sci. Technol. A 3(3) May/June 1985, pp. 867–872.

(List continued on next page.)

*Primary Examiner*—Brian E. Hearn
*Assistant Examiner*—William Bunch
*Attorney, Agent, or Firm*—Oblon, Spivak, McClelland, Maier & Neustadt

[57] ABSTRACT

A remote plasma enhanced CVD apparatus and method for growing semiconductor layers on a substrate, wherein an intermediate feed gas, which does not itself contain constituent elements to be deposited, is first activated in an activation region to produce plural reactive species of the feed gas. These reactive species are then spatially filtered to remove selected of the reactive species, leaving only other, typically metastable, species which are then mixed with a carrier gas including constituent elements to be deposited on the substrate. During this mixing, the selected spatially filtered reactive species of the feed gas chemically interacts, i.e., partially dissociates and activates, in the gas phase, the carrier gas, with the process variables being selected so that there is no back-diffusion of gases or reactive species into the feed gas activation region. The dissociated and activated carrier gas along with the surviving reactive species of the feed gas then flows to the substrate. At the substrate, the surviving reactive species of the feed gas further dissociate the carrier gas and order the activated carrier gas species on the substrate whereby the desired epitaxial semiconductor layer is grown on the substrate.

15 Claims, 2 Drawing Sheets

U.S. PATENT DOCUMENTS

| | | | |
|---|---|---|---|
| 4,546,726 | 10/1985 | Nagasaka et al. | 118/719 |
| 4,579,623 | 4/1986 | Suzuki et al. | 427/39 |
| 4,583,492 | 4/1986 | Cowher et al. | 118/50.1 |
| 4,657,777 | 4/1987 | Hirooka et al. | 427/39 |
| 4,683,838 | 8/1987 | Kimura et al. | 427/38 |
| 4,716,852 | 1/1988 | Tsujii et al. | 118/723 |

OTHER PUBLICATIONS

Y. Toyoshima et al., Ar($^3P_2$) Induced Chemical Vapor Deposition of Hydrogenated Armorphous Silicon, Appl. Phys. Lett. 46(6), Mar. 15, 1985, pp. 584–586.

Rudder et al., Remote Plasma-Enhanced Chemical ∝ Vapor Deposition of Epitaxial Ge Films, J. Appl. Phys. 60(10), Nov. 15, 1986, pp. 3519–3522.

Article from Science, vol. 234 "Is Diamond The New Wonder Material?" pp. 1074–1076.

Article from Electronics International, Nov. 3, 1981, pp. 82 and 84 "Thin Si Films Can Form At Room Temperature".

Yamazaki et al., "Silicon Nitride Prepared By The $SiH_4$–$NH_3$ Reaction With Catalysts, Japanese Journal of Applied Physics," vol. 9, No. 12, Dec. 1970, pp. 1467–1477.

Namba et al., "Structural Study of the Diamond Phase Carbon Films Produced by Ionized Deposition", J. Vac. Sci. Technol., A 3(2), Mar./Apr. 1985, pp. 319–323.

Matsumoto et al., "Vapor Deposition of Diamond Particles from Methane," Jap. J. Appl. Phys., vol. 21, No. 4, Apr. 1982, pp. L183–L185.

REMOTE PLASMA ENHANCED CVD METHOD FOR GROWING AN EPITAXIAL SEMICONDUCTOR LAYER

BACKGROUND OF THE INVENTION

1. Field of the Invention

This invention relates to a remote plasma enhanced chemical vapor deposition (RPECVD) apparatus and method for growing an epitaxial semiconductor layer.

2. Discussion of Background

Plasma enhanced processes have figured prominently in research efforts to lower process temperatures. In conventional plasma enhanced chemical vapor deposition (PECVD), the parent gas molecules are dissociated into precursor atoms and radicals which can deposit on substrates at lower temperatures than in thermal chemical vapor deposition. The deposition occurs at lower temperatures than purely pyrolytic processes because the plasma supplied energy to break chemical bonds in the parent molecules that would only be broken by thermal decomposition if the plasma were not present. Parent molecule dissociation is accomplished in the plasma through various processes involving collisions with electrons, ions, photons, and excited neutral species. Unfortunately, the precursor species are also subject to the same active environment which dissociated the parent molecules. This can lead to further dissociation or reaction of gas phase species to form more complicated radicals before the radicals can condense on the substrate. In a low pressure, low power silane ($SiH_4$) immersion plasma, Matsuda et al. Thin Solid Films 92,171 (1982), have shown using mass spectroscopy that there are a host of gas phase species. These species include H, $H_2$, Si, SiH, $SiH_2$, $SiH_3$, $SiH_4$, $Si_2$, $Si_2H$, $Si_2H_2$, $Si_2H_3$, $Si_2H_4$, and $Si_2H_5$. The most dominant line in the mass spectroscopy is the $SiH_2$ line, even though it is only 12% taller than the $SiH_3$ line and 125% taller than the $Si_2H_5$ line. There is a wide spectrum of precursor species incident on the growing film. A further complication is that in conventional PECVD the substrate is immersed in the plasma region. This results in a large flux of charged species incident on the substrate during film deposition. The incident energies of these ions may be as high as 160 eV in some immersion systems (See Chapman, Glow Discharge Processes, John Willey & Sons, N.Y. 1980, Chap. 4). This can lead to ion implantation, energetic neutral embedment, sputtering, and associated damage. This residual damage must be annealed out during growth if high quality epitaxial layers are to be produced. Thus, this damage imposes a minimum growth temperature, based on annealing conditions below which high quality material cannot be obtained. Thus, there are two major problems associated with conventional PECVD: adequate control over incident gas phase species, and ion damage as a result of the substrate being immersed in the plasma region.

RPECVD deposition of silicon nitride $Si_3N_4$ and silicon $SiO_2$ for gate insulators in (In, Ga) As FET devices has recently been disclosed by Richard et al. J. Vac. Sci. Technol. A3(3), May/June 1985 (pages 867–872). According to this reference, to deposit $SiO_2$, for example, one reactant, $O_2$, is excited in the plasma tube remote from the semiconductor substrate. The other reactant, $SiH_4$, enters the reactor separately, near the substrate and is not excited to a plasma state. An important point is that one of the reactants, $O_2$, bearing one of the component atoms of the $SiO_2$, is introduced through the plasma tube. The process is thought to follow the following reaction model. Monosilane ($SiH_4$) molecules interact with the metastable oxygen $O_x^*(^3P_j)$ flux resulting from the remote plasma. The lifetime of the metastable oxygen is quite long, allowing pathlengths of 1–2 meters in the RPECVD reactor using the $SiO_2$ deposition parameters. (In contrast, the pathlength of a typical metastable excited noble gas specie, e.g. He*, used in the RPECVD epitaxial growth of semiconductor layers, according to the present invention, is 5–30 cm.) This interaction leads to disiloxane, $(SiH_3)_2 O$, formation in the gas phase. On the heated substrate, disiloxane is further oxidized by excess metastable oxygen, O*. This oxidation removes H from the silyl groups, $SiH_3$. Dehydrogenation is accompanied by oxygen bridging of silicon atoms originally bound in adjacent disiloxane molecules on the heated surface. An excess of the plasma excited species is used to drive the dehydrogenation of the silyl groups to completion, minimizing Si-H bonding. Silicon-poor films do not form; thus the process is stable. For this case, CVD can be thought of as a polymerization of disiloxane brought about by oxidation of the SiH bonds of the silyl groups.

Important features of the $SiO_2$ process described by the above-noted Richard et al article are:

1. In the $SiO_2$ process, O is activated by the plasma in the plasma generation region and becomes incorporated in the deposited layers.
2. The interaction between the reactive species existing the plasma generation region and the injected reactant results in the formation of the chemical groups.
3. The lifetimes and therefore the pathlengths of the reactive species exiting the plasma formation is quite long: for metastable oxygen the pathlength is 1–2 meters.
4. The dielectric material formed, $SiO_2$, is an amorphous material and therefore has no long-range or crystalline order. For $SiO_2$ deposition, metastable O* promotes the further oxidation of disiloxane adsorbed on the substrate surface, which reduces the surface of adatoms and enhances the formation of amorphous material.

Another prior art reference of interest is an article by Toyoshima et al, Appl. Phys. Lett. 46(6), Mar. 15, 1985, pp 584–586, which describes a PECVD process to deposit hydrogenated amorphous silicon. However, the deposited a-Si:H films retain from 5–30 atomic percent hydrogen in the deposited layers, which is critical to the performance of a-Si:H, but disastrous if one is trying to grow epitaxial Si layers. No process used to deposit high quality a-Si:H films has proven successful in depositing epitaxial Si layers.

SUMMARY OF THE INVENTION

Accordingly, one object of this invention is to provide a new and improved apparatus and method for growing epitaxial semiconductor layers on a substrate, which overcomes the problems in the prior art PECVD techniques above-noted, including inadequacy of the control over incident gas phase species, ion damage to the substrate, and the lack of excited metastable gas species at the substrate to enhance surface mobility of the adatoms and formation of the epitaxial layer.

Another object of this invention is to provide a novel apparatus and method employing an improved RPECVD approach, by which epitaxial semiconductor layers can be deposited on a substrate maintained at a relatively low temperature.

Still a further object of this invention is to provide a novel RPECVD apparatus and method for growing epitaxial diamond layers on a substrate.

These and other objects are achieved according to the invention by providing a new and improved RPECVD apparatus and method for growing semiconductor layers on a substrate wherein an intermediate feed gas, which does not itself contain constituent elements to be deposited, is first activated in an activation region to produce plural reactive species of the feed gas. These reactive species are then spatially filtered to remove selected of the reactive species, leaving only other, typically metastable, reactive species which are then mixed with a carrier gas including constituent elements to be deposited on the substrate. During this mixing, the selected spatially filtered reactive species of the feed gas chemically interacts, i.e. partially dissociates and activates, in the gas phase, the carrier gas, with the process variables being selected so that there is no back-diffusion of gases or reactive species into the feed gas activation region. The dissociated and activated carrier gas along with the surviving species of the feed gas then flows to the substrate. The surviving reactive species of the carrier gas completely react and the surviving metastable specie of the feed gas completely order the activated carrier species on the substrate whereby the desired epitaxial semiconductor layer is grown on the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
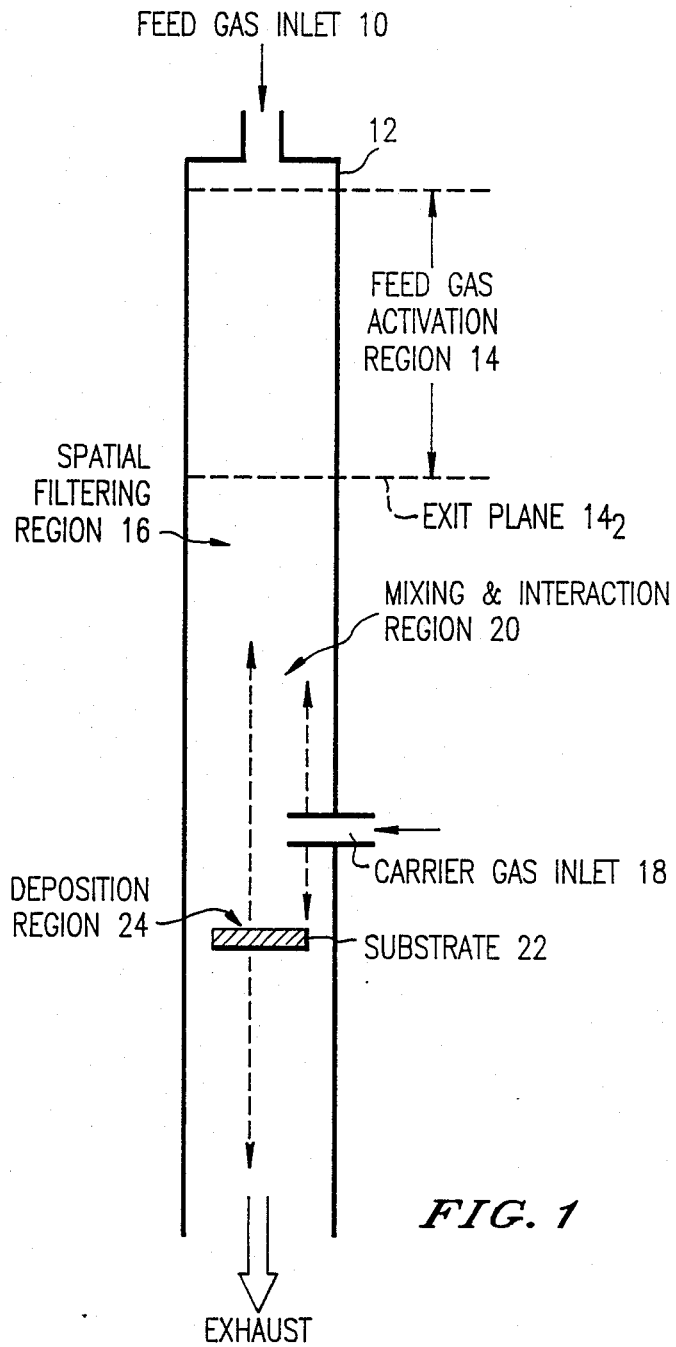
FIG. 1 is a schematic cross-sectional side view of a flow tube schematically illustrating key features of the present invention.

Referring now to the drawings, wherein like reference numerals designate identical or corresponding parts throughout the several views, it is first noted that the reactor design and operating criteria discussed hereinafter are based on the principle of a remote region of activation of a gas or mixture of gases. The activated gas (gases) then plays several roles leading to the deposition of the semiconducting film. Because of the central importance of "remote region of activation" to the present invention, this terminology is first defined referring to FIG. 1.

FIG. 1 shows schematically a section of a flow tube 12. An intermediate feed gas stream (single gas, vapor, or mixture) enters at input inlet 10. In the region of activation 14, the feed gas has its chemical reactivity increased. Chemical reactivity of the feed gas can be increased in many ways. For example, one or more components of the feed gas may be ionized; one or more components of the feed gas may be dissociated into more reactive species, such as converting water vapor into hydrogen and oxygen; or the internal energy of the feed gas may be increased without ionization. This can be accomplished by many methods. Some of these methods can be internal to the flow tube. A sample of these internal methods might include heaters, or catalytic surfaces, and electron or ion bombardment sources. Some methods could be external to the flow tube. A sample of these external methods might include a broad range optical sources (with an appropriately transparent tube), microwave or radio frequency power sources, or simple heaters. Whatever the feed gas(es), the combined means for activation, or the reactive species formed, in the activation region 14, energy is coupled into one or more gases, and that energy can contribute to subsequent chemical reactions.

Figure 2:
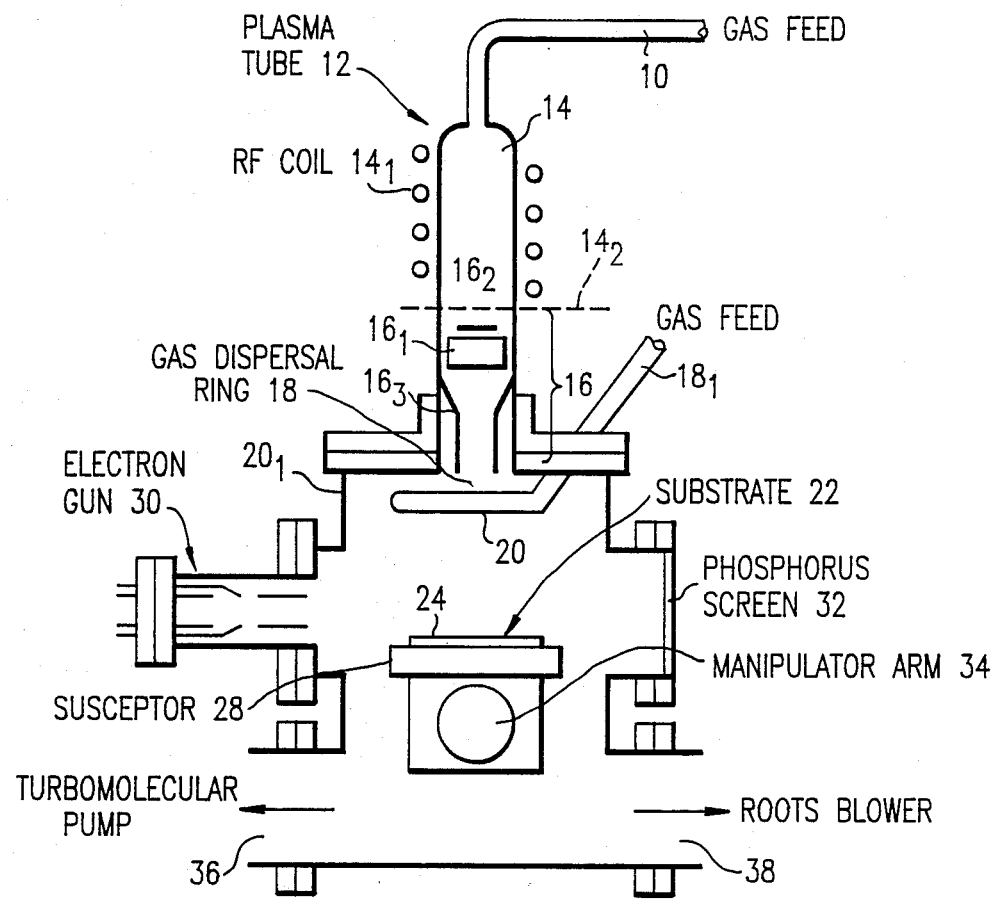
FIG. 2 is a schematic side view illustrating in more detail a RPECVD reaction chamber used according to the present invention.

In experimental studies performed to date, an external radio frequency coil $14_1$, shown in FIG. 2, concentric with the flow tube was used to activate the gas stream.

Referring to FIG. 1, the concept of a "remote" region of activation in the present RPECVD technique will be described. By remote region of activation is meant two things: (1) the substrate is not located in a remote region of activation; (2) in any remote region of activation, only gas(es) from the inlet of that region of activation is(are) present, other gas(es) that may be present in other regions of the apparatus can not reach a remote region of activation by diffusion or other processes that would allow such gas(es) to enter through the exit of a region of activation. To ensure this requires both a suitable reactor design and a proper selection of operating parameters. In the flow system of the present invention, shown in FIGS. 1 and 2, the design of the physical separation of the various regions of the reactor, coupled with the flow velocity of the gas stream (which of course depends on the selection of process parameters) in those regions, determines whether back-diffusion of gases into a region of activation can occur.

As shown in FIG. 1, the present invention includes a feed gas inlet 10 through which a feed gas is entered into a plasma tube 12. In an activation region 14, the chemical reactivity of the feed gas is increased to produce reactive species of the feed gas which pass downstream of the exit plane $14_2$ in the downward direction shown in FIG. 1. Between the exit plane $14_2$ and the carrier gas inlet 18, the feed gas reactive species are filtered such that only the desired specie reaches the gas inlet 18 where it mixes and interacts with a carrier gas including a constituent element to be deposited introduced via the inlet 18 in a mixing and interaction region 20.

In a working embodiment of the invention used to date, a radiofrequency coil $14_1$ concentric with the flow tube 12 has been used to create a "plasma" (glow discharge) of the feed gas in the activation region 14. Working examples have used either a pure noble gas plasma feed, as discussed hereinafter, or noble gas mixtures with hydrogen. The plasma environment in the activation region 14 contains many species, even with a simple feed gas like helium. In fact, the feed gas reactive species produced in the activation region 14 include ions, electrons, and a host of excited species all with different composite lifetimes which are influenced by various factors. The flow through the activation region 14 carries the species downstream towards the carrier gas inlet 18 and a substrate 22 mounted in a deposition region 24 downstream of the inlet 18. The distance that the various species can travel before they are annihilated will depend on their composite lifetimes and the flow velocity. According to the invention, the flow velocity of the feed and carrier gases are controlled so as to control the relative abundance of selected of the reacted species at a given distance downstream of the region of activation, such as at the mixing and interaction region 20 at the carrier gas inlet 18. Thus, by controlling the gas flow rates, and by requiring the reactive species of the feed gas to pass from the exit plane to the mixing and interaction region 20, a spatial filtering region 26 is provided downstream of the exit plane 16, in which undesired reactor species are annihilated and only selected of the reactive species are passed downstream towards the mixing and interaction region 20.

Spatial filtering as above described involves two aspects. First, some physical distance between the activation region which excites the feed gas and the region where the carrier gas is introduced must exist. And second, the lifetimes of the desired reactive species must be substantially longer than the lifetimes of those species not desired. Once these criteria are established, spatial filtering occurs because the pumping velocity of the reactive species determines how far downstream from the activation region various species will travel before they decay or be annihilated. For example, in a He discharge, electron impact excites He atoms into a host of excited electronic states. These states include $2^3P$, $2^1P$, $3^3S$, $3^1S$, $3^1P$, $3^3P$, $3^1D$, and $3^3D$. All these states all have energies greater than the metastable $2^3S$ state. However, these states quickly decay to the ground state or one of the lower metastable states, $2^1S$ or $2^3S$ exponentially with a characteristic decay time. This decay time is less than $10^{-7}$ s. As the species are pumped from the discharge regions, the metastables and ground state He atoms are dominant. Of the two metastable states, the $2^1S$ state has the shorter decay time or effective lifetime $2\times 10^{-8}$sec vs $6\times 10^{-3}$sec for the $2^3S$ state. Thus, the host of highly excited He states in the plasma region have been spatially filtered to produce a desired flux of metastable $2^3S$ He atoms at the entrance to the gas mixing region. The unwanted excited species are completely attenuated exponentially along the length of the spatial filter compared to a factor of 3-150 attenuation (for plug velocities of 10-50 m/sec and spatial filter length of 0.3 m) for the desirable metastable specie. For this particular spatial filter design and system operating parameters, all activated gas feed species having effective lifetimes less than $4\times 10^{-3}$ sec will be completely annihilated in the spatial filter.

The spatial filtering region 16 also acts as a backstreaming isolation region which in conjunction with the selected gas flow rates prevents injected carrier gas from the inlet 18 from back diffusing to the exit plane of $14_2$ of the activation region 14.

The flux of activated noble gas species (and by activated it is specifically meant in the sense of internal energy and not kinetic energy) partially dissociates and activates (in the gas phase) the carrier gas. The flux of the activated noble gas species completely reacts and orders the activated carrier species onto the substrate 22 and results in the growth of an epitaxial semiconductor on the substrate. The flux of activated spatially filtered noble gas species enhances surface reactivity and reactant surface mobility in the growth of a single crystal epitaxial layer. The technique of the invention as applied to surface effects can be used in a low pressure process where the mean free path between the exit plane $14_2$ of the activation region 14 and the substrate 22 is such that no gas phase collisions occur.

Three examples of specific semiconductive materials grown using the RPECVD technique according to the invention are next discussed. In these examples, there is no attempt to limit the invention to these specific features of remote region excitation technique, remote region feed gas, reactant feed gas, or specific reactor system design.

In all three examples, reference is made to a schematic of a remote plasma enhanced chemical vapor deposition reactor, shown in FIG. 2. This representation of a RPECVD reactor primarily consists of a plasma tube 12 in which is located the region of activation 14, and an activation source such as an rf coil $14_1$. The plasma tube 12 feeds into a deposition chamber $20_1$ in which is located a gas dispersal ring 18, and the substrate susceptor 28. Additional components include an electron gun 30, phosphorous screen 32, and a manipulator arm 34 used to perform Reflection High Energy Electron Diffraction (RHEED) characterizations of the substrate 22 and the epitaxial semiconductor film deposited thereon. The plasma tube 12 used consists of a 7.6 cm inside diameter pyrex tube. The plasma is driven by a 13.56-MHz rf generator with matching network. The substrates 22 are clamped to a graphite susceptor 28 heated internally by a tungsten halogen lamp (not shown). Substrate temperatures are calibrated using thermocouples (not shown) attached to the surface of a silicon substrate. Gasses are introduced through two separate gas feeds, the plasma feed gas inlet 12 and the carrier gas feed $18_1$ to the gas dispersal ring 18, which serves as the carrier gas feed inlet. The plug velocity of He or other noble gas through the 7.6 cm plasma tube 12 is high enough to prevent back-diffusion of $GeH_4$, $SiH_4$, or $CH_4$. The plug velocities used are 3, 5, and 100 m/s for germanium, silicon, and diamond depositions, respectively. Also shown is an outlet 36 for high vacuum pumping via a turbomolecular pump (not shown), an outlet 38 for pumping the process gasses using a roots blower (not shown) together with a direct drive mechanical pump (not shown). Typical pressures are less than $5\times 10^{-10}$ Torr minimum base pressure when the process gasses are not flowing and 1-300 mTorr during epitaxial growth of a semiconductor layer. The vacuum intake to the roots blower is ballasted with a constant gas load to prevent antibackstreaming of oil vapors. Examples illustrating use of this process to epitaxially grow silicon, germanium, and diamond semiconductor layers are described below.

Epitaxial growth of germanium is accomplished by flowing 200 sccm of He through the plasma tube and 20 sccm of 0.1% $GeH_4$ in He through the gas dispersal ring 18. The pressure is controlled at 200 mTorr. To initiate deposition, 100 W is applied to the rf coil creating a He discharge plasma in the activation region 14. The substrate temperature is typically maintained between 225°-450° C., preferably at 300° C., during growth.

Epitaxial growth is thought to occur through the following processes. The rf energy coupled to the plasma tube establishes a He plasma in the activation region 14. Through a variety of reactions many different species of excited He atoms and ions are created in the plasma, each having its own lifetime. These various species are caused to flow down from the plasma tube toward the gas dispersal ring 18 and the substrate. Each specie can be annihilated through a variety of mechanisms, and therefore, each specie has an average time that it can survive, or effective lifetime, until it is annihilated. This lifetime can be translated into an average distance it will travel below the plasma tube exit plane $14_2$ before it is destroyed. This distance is called the pathlength. The pathlength of a specie is determined by the effective lifetime of the specie and the plug velocity of the He gas flow. Consequently, the system and the growth parameters can be designed and chosen to cause undesired species to be spatially filtered in the spatial filtering region 16 and the desired specie to interact with the reactant molecules and to arrive at the substrate surface. In the present example the specie desired to interact with the reactant $GeH_4$ is the metastable $He(2^3S)$. These metastables play three important roles in the overall growth process:

1. They dissociate the germane molecules through inelastic gas phase collisions;
2. They have inelastic collisions on the growth surface of the film which enhances the surface mobility of the impinging species leading to epitaxy at low surface temperatures; and
3. They can also play a role in dehydrogenation of surface reactants.

These three functions for the metastables will be discussed in further detail below.

The metastable $He(2^3S)$ interacts with the $GeH_4$ through inelastic gas phase collisions, and creates several reaction products. These products may include ionized and neutral $GeH_x$ species, where $0 < x \leq 4$. The most probable products are $GeH_4+$, $GeH_3+$ and $GeH_3$; and the desirable product is $GeH_3$. As the radicals condense on the substrate they must cross-link to form a germanium network. If this process is to form epitaxial layers of germanium, excess hydrogen carried by the free radicals must be liberated and the reactant species must have sufficient surface mobility to form an ordered solid. In the RPECVD process hydrogen removal occurs when He metastables collide with the growth surface.

Epitaxial growth of silicon proceeds much in the same manner as growth of germanium. Again, growth is accomplished by flowing 200 sccm of He through the plasma tube 12 and by flowing 100 sccm He and 1 sccm $SiH_4$ through the gas dispersal ring 18. A rf discharge plasma of 30 W is sustained during deposition. The deposition process occurs at a total pressure in a range of 50-300 mTorr, with 200 mTorr being preferred. The deposition rate is approximately 0.01 nm/s on a Si(100) 1×1 surface at 520° C. Epitaxial growth has been achieved at temperatures as low as 200° C. with best results occurring at about 400° C. The role of the metastable He in the epitaxial growth of silicon is thought to be much the same as described above for the epitaxial growth of germanium.

Epitaxial growth of diamond may be accomplished by flowing a Noble gas (He, Ar, or Xe) through the plasma tube and methane, $CH_4$, through the gas dispersal ring. One important factor that distinguishes growth of diamond from growth of either germanium or silicon is the poly-phasic nature of the deposited material. Depending upon the growth conditions, the deposited layers may be diamond, graphite, amorphous or glassy carbon, or mixtures of these materials. When a hydrocarbon such as methane is excited in a plasma, radicals of the form $CH_x$ are formed. As in the silane example, these radicals interact in the gas phase to form carbon-carbon bonds. The added complication in the carbon case results from the ability of carbon to form not one, but three hybridizations. Thus we get carbon-carbon bonding of the ethane form ($sp^3$ hybridization), of the ethylene form ($sp^2$ hybridization), and of the acetylene form (sp hybridization). The parallel between these gas phase precursors and their solid phase analogues is striking. Diamond ($sp^3$ hybridization) has ethane type bonding, graphite ($sp^2$ hybridization) has ethylene type bonding, and carbynes (sp hybridization) are chainlike compounds with acetylene type bonding. To grow smmiconducting diamond it is necessary to preclude the incorporation of wrong bonds of graphite-like or carbyne-like hybridization. The flux of gaseous precursors with incorrect hybridization onto the film surface is inevitable if the undesirable methane radicals (i.e., the ethylene and carbyne) are formed. Consequently, the design of the growth reactor and the choice of the growth parameters must be properly chosen to form precursors which upon condensation on the substrate promote $sp^3$ hybridization and diamond growth.

The growth of diamond proceeds technically in a similar way as does silicon and germanium. Typically, 500 sccm of He flows through the plasma tube 12 with a 30 sccm dilute mixture of He, $H_2$, and $CH_4$ (4:10:1 by volume) flowing from the gas dispersal ring 18. A rf discharge of 80 W is sustained in the activation region 14 during deposition at a total pressure range of 10-1000 mTorr, typically less than 100 mTorr. The substrate temperatures is varied from 650°-850° C. The quartz plasma tube size is 1.5 in. o.d. insuring a high plug velocity necessary for transporting metastables and radicals to the substrate. Using these growth parameters, diamond films have been grown at the rate of approximately 2000 Å/hr.

While the process technically is very similar to the silicon and germanium growth, the proper choice of noble gas and methane diluent is critical for promoting diamond growth. Because the energy of the He metastable is so high ($\sim 20$ eV), the cross-section for collisional dissociation of the $CH_4$ molecule is low. Thus, the depositional precursor species created by the He are $CH_4+$, $CH_3+$, or $CH_3$, all of which are highly saturated $CH_x$ radicals Also the choice of methane diluent becomes more pertinent. Unlike the growths of silicon and germanium where the silane and germane were diluted in He, diamond growth is more facilitated with hydrogen dilution. The hydrogen serves two roles. First as a source of atomic hydrogen to the nucleating film, it more preferentially etches the graphitic bonds than the diamond bonds. Second, it moderates the gas phase chemistry promoting higher saturation of the $CH_x$ radicals.

In the growth of diamond, $H_2$ is used in surface reactions such as the etching of graphitic bonding units and in gas phase reactions to convert sp and $sp^2$ bonded hydrocarbon radials to $sp^3$ bonding forms. For this purpose the $H_2$ source gs is activated by inversion to atomic hydrogen, $H(H_2 + energy \rightarrow 2H)$. In the basic reactor design shown in FIG. 2 this activation is carried out in one of two ways. By one method, Case 1, the $H_2$ gas enters with the carrier gas stream through the gas disposal ring 18. The $H_2$ is activated through interaction with energetic species of the feed gas that have passed through the spatial filter 14. Because this technique relies on energetic species of the feed gas (ex. metastable He ($2^3S$)), to activate both the hydrogen and the methane, dramatic reduction in deposition rate is observed as $H_2:CH_4$ flow ratios are increased beyond 20:1. This limitation places a severe restriction on the range of gas mixtures for which reasonably efficient diamond deposition rates can be achieved (rates $\geq$ 1Å/sec).

The second method (Case 2) of operation seeks to overcome this limitation. The H2 is introduced with the noble gas feed through the plasma region. This allows direct activation of the $H_2$ ($H_2$+energy→2H) by the plasma. However if this scheme is used at powers typical for pure noble gas plasmas (80 W), dramatic reduction in the production of noble gas metastables by the plasma is observed. This is due to the fact that $H_2$ dissociation occurs at lower energies than He metastable production. Thus the presence of $H_2$ shifts the electron energy distribution of the plasma region to lower energies where metastable noble gas production is inefficient. If it is attempted to overcome this limitation by brute force (i.e. just by increasing the plasma power) a practical limitation is experienced in that high power $H_2$ noble gas plasmas etch the plasma tube releasing (for the usual case of quartz or pyrex tubes) silicon, oxygen, and a variety of trace contaminants that travel downstream with the gas flow and are incorporated in the growing diamond film.

A comprehensive solution to the problem involves an important extension of the concept of remote region of activation, that is, the use of multiple remote regions of activation. In this specific case two separate plasma tubes are operated. One with a $H_2$ gas flow and plasma conditions optimized for H atom production, and one with a noble gas flow (e.g., He) with plasma conditions optimized for metastable production. This scheme avoids the tube errosion and contamination problems noted in Case 2 above, because mixed $H_2$, noble gas plasmas are not formed and $H_2$ plasma power densities are significantly reduced (reduction factor > 10). At the same time the separate $H_2$ plasma is more efficient (by orders of magnitude) in the creation of atomic hydrogen as compared to the metastable activated scheme (Case 1 above). In addition since the cross section for energy exchange between excited metastable noble gas species and atomic hydrogen is much less (order of magnitude) then the same cross section for molecules $H_2$, the multiple remote regions of activation concept allows both higher deposition rates (rate~7Å/sec) and a much broader range of accessible effective H:$CH_4$ ratios than Case 1 above, thus allowing improvements both in film quality and deposition rate.

It should be noted that this is one specific example of the broad concept of multiple remote regions of activation, where such regions can differ in many ways including source material (e.g., gas feed as in the example above), means of activation (RF, thermal, etc.) spatial filter design, and so on. Indeed, the multiple activation region concept permits optimization of spatial filter designs which for mixed gas sources otherwise would of necessity involve design compromises based on the differing criteria for exclusion of the unwanted reactive species of two different parent gases.

Further commenting on the spatial filtering employed according to the present invention, the design of the spatial filter in large part provides the flexibility in the remote region of activation scheme. First, it is noted that the region of spatial filtration works in both directions. First it is optimized to transmit the desired excited species from the region of activation (e.g., R.F. plasma) to the mixing region while suppressing the transmission of other excited species created in the region of activation. Second and equally important, it supports the remote aspect of a region of activation by allowing the suppression of back-diffusion of an species present in the deposition chamber. Thus without a spatial filter the region of activation cannot be remote.

In order to realize the flexibility of the scheme, it is important to realize that the spatial filter is not simply a time delay where merely the intrinsic lifetime of the various reactive species is allowed to change the relative distribution of reactive species at different planes (times) downstream of the region of activation. If this was true, the technique would be restricted to enhancing only the intrinsically longer lived species and would be unable to separate species with nearly equal intrinsic lifetimes.

Fortunately the intrinsic lifetime is only one component of the crucial parameter, the effective lifetime. The effective lifetime can be controlled in many cases. Consider the example presently disclosed herein for epitaxial growth of semiconductors (Si, Ge, C), oxygen and oxygen containing gases (e.g., $H_2O$) are common contaminants of feed gases such as He. Oxygen is readily activated to a metastable state in an R.F. plasma. In addition metastable oxygen species have lifetimes far longer (factor of 100) than noble gas metastables. Thus a small amount of oxygen or oxygen containing contaminants in the feed gas will have a disproportionately large effect on the growing film. However by incorporating a wall element $16_1$ providing an aluminum wall surface in a portion of the spatial filter we effectively quench the metastable oxygen while having no appreciable effect on the metastable noble gas flux. Wall interactions are extremely important (dominate at pressure < 10 Torr) in determining effective lifetimes, thus flow dimensions and materials of construction of the spatial filter can be used to engineer the relative effective lifetimes and the resultant transmission characteristics of the spatial filter. Note that in this case (oxygen in noble gas) the spatial filter is designed to eliminate the normally longer lived species.

An additional way to design the spatial filtering selectivity is to insert a baffle plate $16_2$ downstream of the plasma region generally midway in the spatial filtering region to increase the back pressure. In this way, those reactive species which have effective lifetimes which decrease as a function of pressure will have a greater susceptibility to annihilation. By locating the baffle plate $16_2$ generally midway in the spatial filtering region, sufficient forward flow of feed gas reactive species is produced to prevent back-diffusion.

Because of the importance of wall interactions, the downstream end $16_3$ of the spatial filter tubulation is normally extended through the chamber wall. Thus, the wall material of choice for gas stream interactions is maintained, independent of the considerations governing the selection of deposition chamber material. In the interior of the deposition chamber, the large increase in cross section relative to the spatial filter tubulation $16_3$ and the flow pattern resulting from the high velocity gas stream introduced through the spatial filter exit plane minimize any effect of wall interactions in the deposition chamber. This design feature is referred to as a reentrant source tubulation. It is shown in FIG. 2.

One of the foremost problems in low temperature chemical vapor deposition is the removal of hydrogen from the nucleating film. For $CH_4$ the spontaneous desorption of hydrogen occurs around 1000° C. For $SiH_4$ it is around 500° C. For $GeH_4$ it is around 350° C. Growth of diamond, silicon, or germanium below these respective temperatures then requires some other process besides thermal desorption to rid the deposited layers of hydrogen. One approach is to supply the surface which some other source of energy, photons, electrons, ions, etc.

According to the present invention, a flux of metastables is supplied to the deposition surface. The same metastables which dissociate bonds in the gas phase can liberate hydrogen bonded on the nucleating solid. This is accomplished by keeping the carrier gas concentrations low to prevent total quenching of the metastable in the reaction zone. However, because quenching of the metastables is necessary to form precursor species which can deposit at lower temperatures, there is a compromise made between the deposition rate determined by how many metastables are quenched and the dehydrogenation rate determined by how many metastables survive the reaction zone and are incident on the substrate.

One approach developed according to the present invention uses a sequentially pulsed growth technique where one deposits for some determinant period of time with the carrier gas flowing, removes the carrier gas, and dehydrogenates for some determinant period of time. The growth period is sustained long enough to deposit a monolayer of material. The dehydrogenation period is sustained long enough to rid the deposited monolayer of hydrogen. Because the carrier gasses are not quenching the metastable flux, the metastable flux to the surface would be maximum and the dehydrogenation time minimized. One might also expect that the metastable flux to the surface to impart energy to the adsorbed atoms and increase their mobility on the growth surface. In general, the higher the surface atom mobility is, the better the crystal will grow. The following are key operating parameters of the pulsed growth sequence technique of the present invention:

Deposition Sequence
    Ar 200 sccm plasma tube
    Ar 50 sccm ring feed
    $SiH_4$ 10 sccm ring (2% $SiH_4$ in He)
    Pressure 0.200 Torr
    rf power 40 W
    substrate temperature 200° C.
    deposition time 1 min Dehydrogenation Sequence
    Ar 200 sccm plasma tube
    Ar 50 sccm ring feed
    $SiH_4$ O sccm ring
    Pressure 0.200 Torr
    rf power 40 W
    substrate temperature 200° C.
    dehydrogenation time 30 sec The overall sequence includes repeated alternate performances of the above noted deposition and dehydrogenation sequences.

Remote plasma enhanced chemical vapor deposition, RPECVD, according to the present invention, avoids the problems associated with conventional PECVD techniques. There are three primary differences between RPECVD and PECVD. First, the parent gas molecules are not excited in the plasma region but instead react with excited, metastable gas species that flow from the plasma region. These metastable species have well-defined metastable energy states that are 4–20 eV above their ground state, depending upon which noble gas is used. By selecting the appropriate noble gas, it is possible to tune the energy increment used in the metastable specie. The coupling of this energy into the parent molecules during collisional events determines the gas phase species. The plug velocity of gas through the plasma tube prohibits back-diffusion of parent molecules into the plasma region. Because there is a fairly limited number of collisional by-products, the RPECVD process offers more control the type of species that is incident on the growth surface during a deposition. Table I shows a list of the collisional by-products obtained when different noble gas metastables collide with methane (see Bolden et al., J. Phys. B.: 3,71 (1970) and Balamuta et al, J. Chem. Phys. 79,2822 (1983)), as follows:

TABLE I

| NOBLE GAS SPECIES | BY-PRODUCT |
|---|---|
| He | $CH_4^+$, $CH_3^+$, $CH_2^+$ |
| Ar | $CH_3$, $CH_2$ |
| Xe | $CH_3$ |

A second primary difference between PECVD and RPECVD is that in RPECVD, unlike in conventional PECVD, the substrates are well removed from the plasma region, minimizing the plasma densities near the substrate. This should result in virtually no sheath fields between the substrate and the plasma in contrast to immersion systems. Ions created by Penning processes in the vicinity of the substrate see no large sheath fields to accelerate them. Furthermore, with typical deposition pressures between 100 and 300 mTorr, the ions are thermalized, reducng their incident energy on the substrates. Considering the damage and embedment that has been observed in silicon from even moderately low energy ions ($<50$ eV), reduction of ion flux and energy is certainly an advantage offered by RPECVD. This feature allows extremely low deposition temperature unconstrained by annealing considerations.

A third difference between the disclosed RPECVD apparatus to grow epitaxial layers and typical PECVD apparatus is the ultra-high vacuum capability of the RPECVD apparatus. As explained below, this ultra-high vacuum capability of the RPECVD, base pressure less than $5 \times 10^{-10}$ Torr, is required to obtain epitaxial layers of sufficient quality for electronic device applications. On the other hand, the PECVD apparatus has a base pressure typically of $1 \times 10^{-6}$ Torr, and never better than $1 \times 10^{-8}$ Torr. These base pressures for the PECVD systems, are completely inadequate to grow epitaxial semiconductor layers.

Important features of the RPECVD epitaxial growth process that clearly distinguish it from the $SiO_2$ RPECVD deposition process are:

1. In RPECVD epitaxial growth, no element of the deposited layers passes through the plasma region. In the $SiO_2$ process, O is activated by the plasma and becomes incorporated in the deposited layers.
2. Furthermore, the reaction between the metastable species exiting the plasma tube and the reactant injected by the gas dispersal ring is very different in the two examples. For RPECVD epitaxial growth, the metastable-reactant interaction results in the dissociation of the reactant or parent group. In the case of $SiO_2$ deposition, this interaction results in the formation of chemical groups.
3. The effective lifetimes and, therefore, the pathlengths of the metastable species exiting the plasma tube are quite different in the two cases: for metastable oxygen the pathlength is 1–2 meters, whereas, for metastable He*, the pathlength is a few centimeters.

4. The Si epitaxial material is a crystalline material which needs long-range order to obtain good semiconducting properties. Conversely, the dielectric material $SiO_2$ is an amorphous material, and, therefore, has no long-range or crystalline order. In RPECVD epitaxial growth, metastable He* promotes long-range order through increasing the surface mobility of the adatoms. For $SiO_2$ deposition, metastable O* promotes the further oxydation of disiloxane adsorbed on the substrate surface, which reduces the surface mobility of adatoms and enhances the formation of amorphous material. While these differences are illustrated for RPECVD of epitaxial Si and amorphous $SiO_2$, they apply to the general techniques of RPECVD of single crystal epitaxial layers of semiconductor materials and RPECVD of amorphous dielectric materials. Because these differences between the two deposition processes are quite fundamental, they therefore require different reaction chamber designs, especially with respect to cross-section, distance from the plasma tube to the substrate and plug velocity, and process parameters, including pressure, flow velocity, excitation levels and reactant concentrations.

In any type of epitaxial process the order and cleanliness of the starting surfaces are of paramount importance. This is especially true in any low temperature epitaxial process where adsorbed atoms may not have enough mobility unless the energy is provided by some other source other than thermal. In the RPECVD apparatus and process according to the invention, two techniques that use the flux of excited or dissociated species from the plasma region to clean substrates of residual contaminants have been developed. The first technique involves dissociation of molecular hydrogen in the plasma region and transport of atomic hydrogen to the substrate surface. There the hydrogen reacts with residual carbon and oxygen atoms forming volatile compounds which leave the surface. Typical operating conditions for this process are 80–100 sccm $H_2$ plasma, 4–5 mTorr, 35 Watts, 300° C. substrate temperature, and 20 scc time duration. Because atomic hydrogen may react with the glass walls of the plasma tube, this process has been refined. Now, metastable species of Ar, generated in the plasma region 14, interact with hydrogen flowing from the ring feed 18 to form atomic hydrogen. The plug velocity of the Ar is kept high to prevent hydrogen from back-diffusing into the plasma region. Typical operating conditions for the refined cleaning process are 200 sccm Ar plasma, 50 sccm $H_2$ ring, 100 mTorr, 50 Watts, 300° C. substrate temperature, and 30 s time duration. Here as before, the atomic hydrogen reacts with the residual contaminants on the substrate to form volatile compounds and leave the surface. Without these effective hydrogen cleaning procedures, none of the epitaxial work would be possible. As with the epitaxial growth, it is the flux of particular selected species from the excitation region to the substrate that is the key to these processes.

Following use of the cleaning procedure and before limitation of the epitaxial growth process it is very important to prevent re-contamination of the substrate surface by undesirable gas species which constitute the background or "base" pressure of the growth apparatus. These contaminants can impinge the substrate from a variety of sources including the several surfaces present in the growth apparatus. Therefore, it is very important to minimize the concentration of these contaminant species in the apparatus through maintaining a very low base pressure, less than $5 \times 10^{-10}$ Torr. Base pressures larger than this value, through contamination and disruption of the crystalline order of the cleaned substrate surface, will significantly degrade the quality of the epitaxial grown layer. For example, at a base pressure of $5 \times 10^{-10}$ Torr, 10 percent of the substrate surface, will be covered with new contaminants after only 4 minutes. Yet, a 10 percent surface contamination will create an unacceptably large crystalline point defect density between $10^{20}$ and $10^{21}$ in the epitaxial layer. Consequently, the requirement of base pressure less than $5 \times 10^{-10}$ Torr is a minimum requirement.

It should further be understood that while the RPECVD technique of the invention employs a feed gas activation region which certainly is physically remote from the deposition region, it is also chemically remote because back-diffusion into the activation region is prevented and only selected activated gas species such as the metastable noble gas species arrive at the substrate surface.

Other considerations important to the present RPECVD apparatus and method growth of epitaxial layers of semiconductor materials include:

(1) Design of an ultra high vacuum, pressures less than $5 \times 10^{-10}$ Torr, reaction vessel to maintain surface cleanliness after the in situ cleaning procedures.

(2) Incorporation of RHEED equipment into the reactor design to allow qualification of the surfaces prior to and after the cleaning procedures and/or the depositions.

(3) Use of a reentrant plasma tube to eliminate metal exposure to the plasma environment. It is well known that metals in active plasma environment become eroded leading to metal contamination.

(4) Installation of a complete vacuum system bakeout system from the pump-mouths to the gas bottles. This allows system base pressures to be less than $5 \times 10^{-10}$ Torr.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A method for growing an epitaxial semiconductor layer on a substrate mounted in a deposition chamber, comprising:
   cleaning the surface of said substrate to remove impurities from the substrate surface;
   introducing an intermediate feed gas to an inlet of an activation region remote from said substrate at a predetermined flow velocity;
   imparting energy to said intermediate feed gas in said activation region to produce an activated feed gas of plural reaction species, said plural reactive species exiting said activation region at an exit plane;
   spatial filtering the activated intermediate feed gas so that selected of said reactive species are annihilated and so that only selected of the reactive species survive and flow on to said deposition chamber;

introducing a carrier gas including a gas having a constituent element of said semiconductor layer to be deposited into said deposition chamber at a predetermined flow velocity in a mixture region where the carrier gas mixes with the surviving reactive species of the activated intermediate feed gas so that said surviving reactive species transfer energy to the carrier gas and partially disassociate and activate the carrier gas into plural reactive species;

depositing said semiconductor layer on said substrate by selecting the flow velocities of said intermediate feed and said carrier gas so that the reactive species of the carrier gas and the surviving reactive species of the intermediate feed gas flow downstream of the mixing region to a deposition region where said substrate is located and so that no back-diffusion of carrier gas, carrier gas reactive species and intermediate feed gas reactive species occurs upstream of said exit plane;

wherein the surviving reactive species of the intermediate feed gas activate the carrier gas and form activated species of the carrier gas which are ordered and further dissociate through subsequent reactions with said surviving reactive species of said intermediate feed gas on said substrate.

2. A method according to claim 1, comprising:
maintaining said deposition region at a pressure between 1-1000 mTorr; and
maintaining said substrate at a temperature of 200°-850° C.

3. A method according to claim 1, wherein a germanium epitaxial layer is formed on said substrate, comprising:
selecting a noble gas as said intermediate feed gas;
selecting GeH$_4$ as a constituent of said carrier gas;
maintaining said deposition region at a pressure in a range of 50-300 mTorr; and
maintaining the substrate at a temperature between 225°-450° C.

4. A method according to claim 1, comprising:
selecting He as a constituent of said intermediate feed gas; and
selecting the flow velocities of said intermediate feed and carrier gases so that the surviving reactive species of the intermediate feed gas comprises He($2^3$S).

5. A method according to claim 1, wherein a silicon epitaxial layer is formed on said substrate, comprising:
selecting a noble gas as a constituent of said intermediate feed gas;
selecting SiH$_4$ as a constituent of said carrier gas;
maintaining said deposition region at a pressure in a range of 50-300 mTorr;
maintaining the substrate at a temperature between 200°-520° C.

6. A method according to claim 5, comprising:
selecting He as a constituent of said intermediate feed gas; and
selecting the flow velocities of said intermediate feed and carrier gases so that the surviving reactive species of the intermediate feed gas comprises He($2^3$S).

7. A method according to claim 1, wherein a diamond epitaxial layer is formed on said substrate, comprising:
selecting a noble gas as a constituent of said intermediate feed gas;

selecting hydrogen and methane as constituents of said carrier gas;
maintaining said deposition region at a pressure in a range of 10-1000 mTorr;
maintaining the substrate at a temperature between 650°-850° C.

8. A method according to claim 1, wherein said cleaning step comprises:
introducing hydrogen into said activation region;
imparting energy to said hydrogen in the activation region to produce plural reactive species of hydrogen;
selecting the flow velocity of the introduced hydrogen so that said reactive species of hydrogen are spatially filtered and surviving of the hydrogen reactive species pass to said substrate and remove impurities from said substrate.

9. A method according to claim 1, wherein said cleaning step comprises:
introducing a noble gas into said activation region at a predetermined flow velocity;
imparting energy to said noble gas in said activation region to produce plural reactive species of said noble gas;
spatially filtering the plural reactive species of said noble gas and passing selected surviving noble gas reactive species to said deposition chamber;
introducing hydrogen at a predetermined flow velocity into said mixing region and mixing the surviving noble gas reactive species with hydrogen in said mixing region to transfer energy to said hydrogen thereby to produce reactive species of hydrogen;
selecting the flow velocities of said noble gas and hydrogen so that no back-diffusion of reactive species of noble gas, reactive species of hydrogen, and hydrogen beyond said exit plane occurs and so that the surviving reactive species of said noble gas and the reactive species of hydrogen pass to the substrate and remove impurities from the substrate.

10. A method according to claim 1, further comprising:
cutting off for a predetermined time period the flow of the gas having said constituent element to be deposited after said depositing step proceeds a predetermined time, thereby to dehydrogenate said substrate;
recommencing introducing said gas having said constituent element after dehydrogenation of said substrate proceeds for a predetermined time period.

11. A method according to claim 1, wherein said intermediate feed gas comprises plural distinct gas constituents, comprising:
activating selected of said plural intermediate feed gas constituents in respective separate activation regions;
separately spatially filtering the reactive species of the intermediate feed gas constituent reactive species separately activated in respective activation regions; and
combining the spatial filtered reactive species derived from the respective activated intermediate feed gas constituents in the mixing region in the deposition chamber.

12. A method according to claim 11, wherein the intermediate feed gas comprises hydrogen and a noble gas, each of which is separately activated and separately spatially filtered.

13. A method according to claim 1, wherein said spatial filtering step comprises:
inserting a wall element made of a material which quenches predetermined feed gas reactive species having an intrinsic lifetime longer than the selected feed gas reactive species in communication with the feed gas reactive species to annihilate the reactive species having the longer intrinsic lifetime.

14. A method according to claim 1, comprising:
increasing the pressure of the intermediate feed gas reactive species during spatial filtering to annihilate feed gas reactive species having effective lifetimes which decrease as a function of pressure.

15. A method according to claim 13, comprising:
increasing the pressure of the intermediate feed gas reactive species during spatial filtering to annihilate intermediate feed gas reactive species having effective lifetimes which decrease a a function of pressure.

* * * * *

UNITED STATES PATENT AND TRADEMARK OFFICE
CERTIFICATE OF CORRECTION

PATENT NO. : 4,870,030

DATED : September 26, 1989

INVENTOR(S) : MARKUNAS ET AL.

It is certified that error appears in the above-identified patent and that said Letters Patent is hereby corrected as shown below:

Title page:
    Before column 1, line 5, insert

--This invention was made with U.S. Government support under contract N00014/84/C/0659 awarded by the U.S. Department of the Navy. The U.S. Government has certain rights in this invention.--

Signed and Sealed this

Fourth Day of February, 1992

Attest:

HARRY F. MANBECK, JR.

Attesting Officer

Commissioner of Patents and Trademarks